United States Patent [19]

Kawauchi

[11] Patent Number: 5,706,203

[45] Date of Patent: Jan. 6, 1998

[54] WAVEFORM MEASURING APPARATUS FOR EASILY PROVIDING PRETRIGGER FUNCTION BY USING FIFO MEMORY

[75] Inventor: Takehiko Kawauchi, Atsugi, Japan

[73] Assignee: Anritsu Corporation, Tokyo, Japan

[21] Appl. No.: 591,173

[22] Filed: Jan. 16, 1996

[30] Foreign Application Priority Data

Jan. 25, 1995 [JP] Japan .................................. 7-030158

[51] Int. Cl.⁶ .................................................. G01R 13/20
[52] U.S. Cl. .......................... 364/487; 364/483; 364/484; 364/485; 364/486; 324/76.12; 324/76.15; 324/76.19; 324/121 R; 341/122; 341/126; 345/134
[58] Field of Search ........................... 364/487, 483–486, 364/724.1, 724.14; 324/76.12, 76.15, 76.19, 121 R; 341/110, 122, 123, 126, 155; 345/133, 134

[56] References Cited

U.S. PATENT DOCUMENTS

| | | | |
|---|---|---|---|
| 4,495,586 | 1/1985 | Andrews | 364/487 |
| 4,694,244 | 9/1987 | Whiteside et al. | 324/121 R |
| 4,835,675 | 5/1989 | Kawai | 395/183.21 |
| 5,039,937 | 8/1991 | Mandt et al. | 324/121 R |
| 5,252,977 | 10/1993 | Lueker et al. | 341/182 |
| 5,315,627 | 5/1994 | Draving | 377/20 |
| 5,375,067 | 12/1994 | Berchin | 364/487 |
| 5,397,981 | 3/1995 | Wiggers | 324/121 R |

FOREIGN PATENT DOCUMENTS 61-31438  9/1986  Japan.

Primary Examiner—Emanuel T. Voeltz
Assistant Examiner—Tuan Q. Dam
Attorney, Agent, or Firm—Frishauf, Holtz, Goodman, Langer & Chick, P.C.

[57] ABSTRACT

A waveform measuring apparatus having a dummy readout circuit which applies first read signals of a same period as sampling signals to a read clock terminal of a FIFO memory during an interval between a first moment that a trigger enable signal is outputted from a prepoint counter when digital samples have been stored in the FIFO memory up to a predetermined number (a prepoint value) and a second moment that a trigger signal is generated by a trigger signal generating circuit. Concurrent reading from and writing to the FIFO memory is thereby permitted with a difference between the write pointer value and the read pointer value kept equal to the prepoint value. When a trigger signal is generated, digital data are written into the FIFO memory until the write pointer value catches up with the read pointer value and digital data are read from the FIFO memory by second read signals applied to it by a control unit. A display unit displays the waveform of the measured signal.

7 Claims, 5 Drawing Sheets

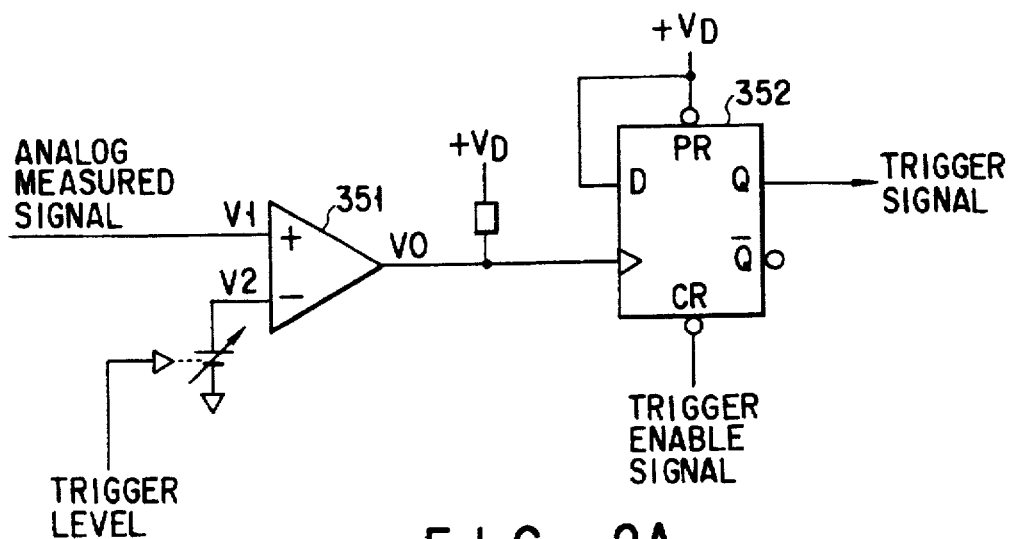
F I G. 2A
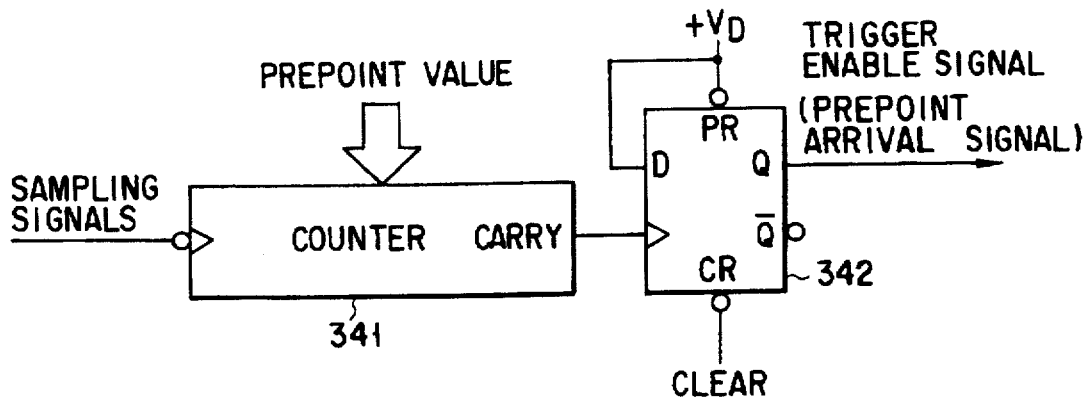
F I G. 2B
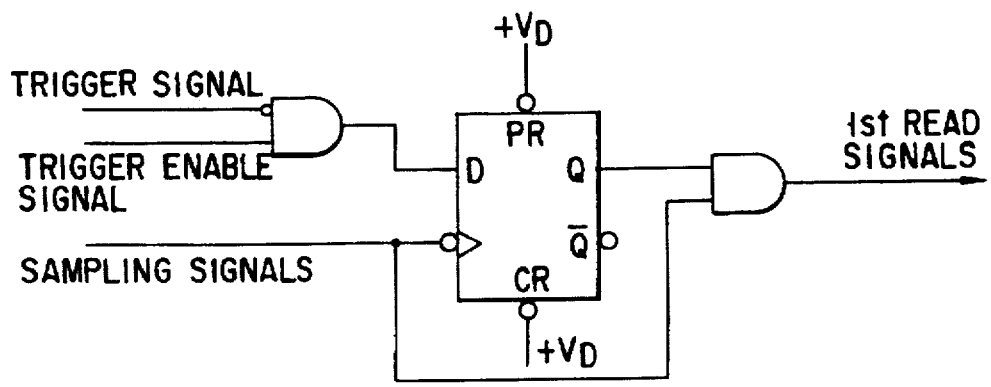
F I G. 2C

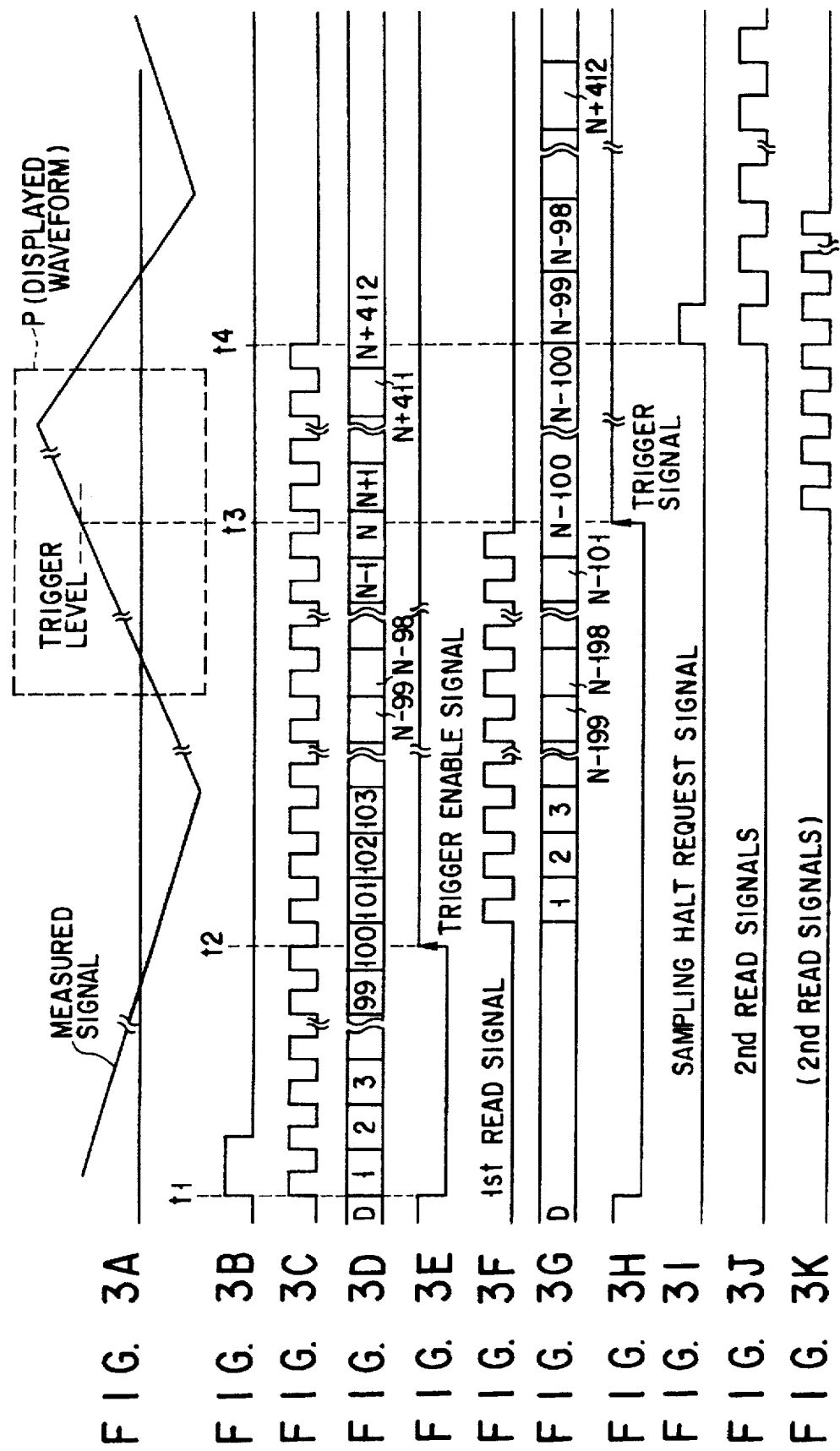

WAVEFORM MEASURING APPARATUS FOR EASILY PROVIDING PRETRIGGER FUNCTION BY USING FIFO MEMORY

BACKGROUND OF THE INVENTION

1. Field of the Invention

The present invention relates to a waveform measuring apparatus, and more particularly to a waveform measuring apparatus which is used as a time-base waveform measuring unit based on time-domain sweep, such as a digital oscilloscope, spectrum analyzer, or the like, and converts analog signals to digital signals for displaying or outputting waveforms.

2. Description of the Related Art

For example, in analog-type oscilloscopes, the scanning of a time base is started at the timing that the amplitude level of an input measured signal crosses a preset trigger level (hereinafter referred to as the trigger occurrence timing) to synchronize the time base with the measured signal, so that periodic measured signals are displayed on the display screen with their waveform stilled.

However, such an analog system that commences a time base at the trigger occurrence timing cannot implement a function of observing a portion of the waveform of a measured signal it had prior to crossing a trigger level, which is referred to as a pretrigger function.

For this reason, the pretrigger function is implemented by a digital-type waveform measuring apparatus that commences converting a measured signal to a digital signal before it crosses a trigger level, stores the digital data in a memory, reads initial data prior to the trigger occurrence time from the memory in a sequential order of time, and displays the waveform.

FIG. 5 is a block diagram of a conventional waveform measuring apparatus 10 which has a pretrigger function.

In FIG. 5, a sampling signal generating circuit 11 provides sampling signals of a given frequency to an analog-to-digital (A/D) converter 12, an address counter 13, a prepoint counter 14, a postpoint counter 15, and a write signal generating circuit 16 during the time interval from the time that a sampling commencement request signal is received from a control unit 20 to be described later to the time that a sampling halt request signal is received.

The A/D converter 12 samples an analog measured signal at the sampling signal frequency, converts it into digital data, and outputs the digital data to a random access memory (RAM) 19 which will be described later.

The address counter 13 comprises a ring binary counter providing a 9-bit output by way of example and, with each sampling signal, advances an address value for the RAM 19 by one from 0 to 511 in decimal, thereby storing the most recent 512 digital data in the RAM 19 until a trigger to be described later occurs.

The prepoint counter 14 outputs a trigger enable signal when it receives sampling signals until a preset prepoint value (e.g., 100) is reached which is defined as the number of digital data constituting a displayed waveform prior to the trigger occurrence time, that is, when digital data corresponding in number to the prepoint value are stored in the RAM 19.

The postpoint counter 15 outputs a sampling halt request signal to the sampling signal generating circuit 11 and the control unit 20 when it receives sampling signals corresponding in number to a preset postpoint value (e.g., 412=512–prepoint value) that is defined as the number of digital data constituting a displayed waveform after a trigger has occurred.

The postpoint counter 15 is provided for the purpose of disabling the sampling signal generating circuit 11 from generating the sampling signals when a required number (412) of digital data has been stored in the RAM 19 since the time of receipt of a trigger signal. Otherwise, the address counter 13 would further advance the RAM address to rewrite and update effective stored data.

The write signal generating circuit 16 outputs a write signal to the RAM 19 so that the output of the A/D converter 12 will be stored in the RAM at times when both the output of the address counter 13 and the output of the A/D converter, which vary in synchronism with the sampling signals, are stable.

In FIG. 5, on the other hand, a trigger generating circuit 17 provides a trigger signal to the postpoint counter 15 and the an address storage circuit 18 at the instant the amplitude of a measured signal crosses a preset trigger level after the receipt of a trigger enable signal from the prepoint counter 14.

The address storage circuit 18 stores the output value of the address counter 13 when it receives the trigger signal.

The RAM 19 is a random access memory which has 512 addresses and, with each write signal, stores a digital data output from the A/D converter 12 in its address indicated by an output value of the address counter 13.

Upon receipt of a sampling halt request signal from the postpoint counter 15, the control unit 20 calculates a data address value that is a prepoint value ahead of an address A stored in the address storage circuit 18, that is, a memory address in which the first digital data of a waveform to be displayed is stored.

The control unit 20 then begins reading digital data from the RAM circuit using the calculated address value as a readout starting address and converts 512 digital data into amplitude data, which, in turn, is applied to a display unit 21.

The display unit 21 displays the waveform composed of a series of amplitude data output from the control unit 20.

In this way, a waveform containing a waveform portion prior to the trigger occurrence time will be displayed on the screen of the display unit 21 as shown in FIG. 6.

However, the prior art waveform measuring apparatus 10 has the following problems to be solved.

(1) The construction of peripheral hardware associated with the RAM is large and complex. And moreover, a process of applying a write signal to the RAM in the state where an address signal and a data signal are both being entered into the RAM stably must be performed during one cycle of the sampling signals. If the sampling interval becomes short, then the timing of signal application will become too critical to accommodate higher speed sampling.

(2) It is not until a readout starting address is calculated by calculations which takes into account the fact that the address counter is arranged in a ring configuration that reading from the RAM is commenced. Therefore, it is impossible to capture waveform data for the next display immediately. This will increase the possibility of overlooking variations in a measured signal which may occur until the next display is provided.

SUMMARY OF THE INVENTION

It is, therefore, an object of the present invention to provide an improved waveform measuring apparatus which is simple in construction, can accommodate faster sampling, and can commence reading effective data immediately with no need to perform calculation processing.

According to an aspect of the present invention there is provided a waveform measuring apparatus responsive to a trigger signal for measuring a waveform of an input signal before and after generation of the trigger signal, comprising: setting means for setting number of measuring points to a desired value before the generation of the trigger signal; sampling signal generating means for generating sampling signals of a given period; analog/digital (A/D) converting means for sampling the input signal at intervals of the period of the sampling signals generated by the sampling signal generating means and converting the input signal into digital data; first-in first-out (FIFO) memory means for storing the digital data outputted from the A/D converting means in synchronism with the sampling signals generated by the sampling signal generating means and outputting the digital data stored in order in which they were stored in synchronism with read signals; first read signal generating means for generating first read signals of the same period as the sampling signals generated by the sampling signal generating means to the FIFO memory means after the FIFO memory means has commenced storing the digital data to thereby sequentially update most recent digital data corresponding in number to the measuring points; trigger generating means for generating the trigger signal to the first read signal generating means after the first read signals has been generated by the first read signal generating means to thereby cause the first read signal generating means to halt generating the first read signals; and second read signal generating means for generating second read signals to the FIFO memory means after the trigger signal has been generated by the trigger signal generating means to thereby read digital data before and after the generation of the trigger signal from the FIFO memory.

According another aspect of the present invention there is provided a waveform measuring apparatus responsive to a trigger signal for measuring a waveform of an input signal before and after the generation of the trigger signal including a desired number of measuring points prior to generation of the trigger signal, comprising: sampling signal generating means for generating sampling signals of a given period; analog/digital (A/D) converting means for sampling the input signal at intervals of the period of the sampling signals generated by the sampling signal generating means and converting the input signal into digital data; first-in first-out (FIFO) memory means for storing the digital data outputted from the A/D converting means in synchronism with the sampling signals generated by the sampling signal generating means and outputting the digital data stored in order in which they were stored in synchronism with read signals; first read signal generating means for generating first read signals of the same period as the sampling signals generated by the sampling signal generating means to the FIFO memory means after the FIFO memory means has commenced storing the digital data to thereby throw digital data corresponding in number to the measuring points away in sequence; trigger generating means for generating the trigger signal to the first read signal generating means after the first read signals has been generated by the first read signal generating means to thereby cause the first read signal generating means to halt generating the first read signals; and second read signal generating means for generating second read signals to the FIFO memory means after the trigger signal has been generated by the trigger signal generating means to thereby read digital samples before and after the generation of the trigger signal from the FIFO memory.

According to still another aspect of the present invention there is provided a waveform measuring instrument comprising: sampling signal generating means for generating sampling signals of a given period; analog/digital (A/D) converting means for sampling an input signal to be measured at intervals of the period of the sampling signals generated by the sampling signal generating means and converting the input signal into digital data; a first-in first-out (FIFO) memory, having an input port, an output port, a write clock terminal, and a read clock terminal, for storing each of the digital data applied from the A/D converting means to the input port in sequence each time the sampling signals generated by the sampling signal generating means is applied to the write clock terminal and outputting stored digital data from the output port, one at a time, each time a read signal is applied to the read clock terminal; a trigger enable circuit for outputting a trigger enable signal when a predetermined number of the sampling signals is supplied from the sampling signal generating means; a trigger signal generating circuit for generating a trigger signal after the trigger enable signal has been outputted from the trigger enable circuit; a dummy readout circuit for applying first read signals of the same period as the sampling signals generated by the sampling signal generating means to the read clock terminal of the FIFO memory during the interval between a first moment that the trigger signal is outputted from the trigger enable circuit and a second moment that the trigger signal is outputted from the trigger signal generating circuit; readout means for, after the trigger signal has been generated, applying to the read clock terminal of the FIFO memory second read signals in place of the first read signals to thereby read digital data stored in the FIFO memory from the output port; and displaying means responsive to the digital data read by the readout means for displaying the waveform of the measured signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A, 2B and 2C show specific arrangements of various parts in the apparatus of FIG. 1;

FIGS. 3A through 3K are timing diagrams for use in explanation of the operation of the apparatus of FIG. 1;

DETAILED DESCRIPTION OF THE PREFERRED EMBODIMENTS

Figure 1:
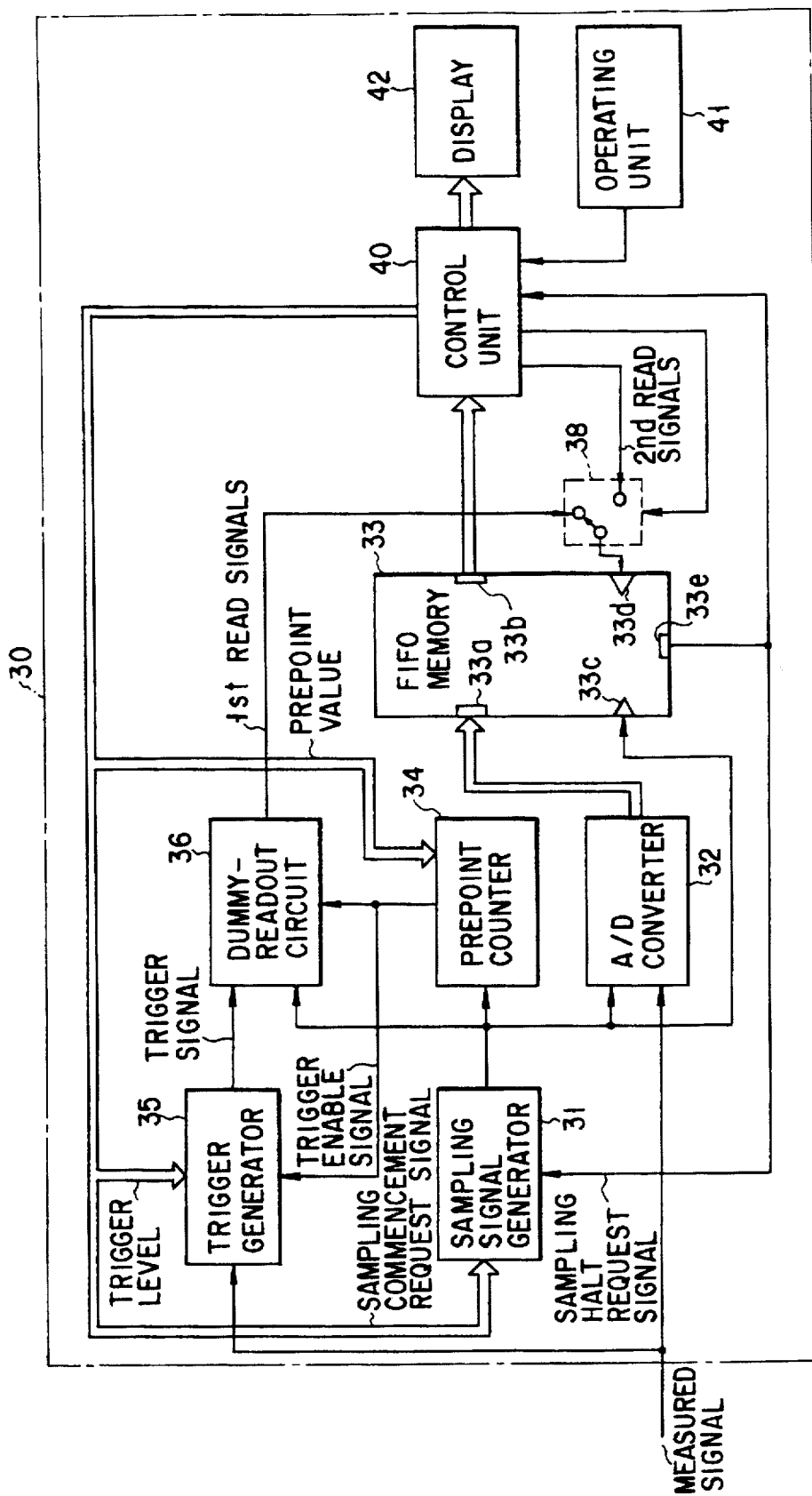
FIG. 1 is a block diagram of a waveform measuring apparatus embodying the invention.

Reference will now be made in detail to the presently preferred embodiment of the invention as illustrated in the accompanying drawings, in which like reference characters designate like or corresponding parts throughout the several drawings.

In FIG. 1, there is illustrated a waveform measuring apparatus embodying the invention. A sampling signal generating circuit 31 provides sampling signals of a given period. An A/D converter 32 samples an input measured signal at intervals of the period of the sampling signals and converts the resulting samples into digital data. A first-in first-out (FIFO) memory 33 has an input port, an output port, a write clock terminal, and a read clock terminal, stores a digital data applied to the input port from the A/D converter every time a sampling signal is applied to the write clock terminal, and outputs each of stored digital data sequentially in the order in which they are stored every time a read signal is applied to the read clock terminal. A trigger enable circuit 34 outputs a trigger enable signal when a predetermined number of sampling signals is output from the sampling signal generating circuit. A trigger generating circuit 35 generates a trigger signal after the trigger enable signal has been output from the trigger enable circuit. A dummy readout circuit 36 provides first read signals of the same period as the sampling signals to the read clock terminal of the FIFO memory during the interval between a first moment that the trigger enable signal is output and a second moment that the trigger signal is generated. A readout means 40 provides, after the trigger signal has been generated, second read signals to the read clock terminal of the FIFO memory in place of the first read signals to thereby read digital data from the FIFO memory through its output port, and display means 40 and 42 display a waveform constructed from digital data read by the readout means.

With the waveform measuring apparatus of the invention thus arranged, digital data from the A/D converter are stored sequentially into the FIFO memory in synchronism with the sampling signals, and the first read signals of the same period as the write signals are applied to the FIFO memory during the interval between the moment that the number of digital data stored in the FIFO memory reaches a predetermined number and the moment that a trigger signal is generated, thereby permitting concurrent writing into and reading from the FIFO memory.

That is, during that interval an operation of writing the most recent digital data into the FIFO memory and an operation of throwing the least recent digital data stored in the FIFO memory away are performed simultaneously. As a result, a predetermined number of recent digital data will be left in the FIFO memory all the time.

By stopping the read operation by the first read signals at the time that a trigger signal is generated, writing in digital data after the trigger occurrence time is performed with a predetermined number of digital samples prior to the trigger occurrence time stored in the FIFO memory.

When the second read signals are applied to the FIFO memory in place of the first read signals after a trigger signal has been generated, digital data are sequentially read from the FIFO memory beginning with a digital data that was stored a predetermined number of digital data ahead of the trigger occurrence time. The digital data thus read are used to display a waveform.

Hereinafter, the waveform measuring apparatus of the invention will be described in more detail.

Upon receipt of a sampling commencement request signal from the control unit 40, the sampling signal generating circuit 31 outputs sampling signals of a given period (e.g., 25 nsec.) until it receives a sampling halt request signal from the control unit.

The A/D converter 32 samples an analog measured signal each time a sampling signal rises and converts each analog sample into a digital data, which, in turn, is applied to the FIFO memory 33.

The FIFO memory 33 has an input port 33a, an output port 33b, a write clock terminal 33c, a read clock terminal 33d, and a flag terminal 33e which are independent of one another. The FIFO memory 33 writes data applied to the input port 33a into its internal area indicated by its write pointer value and then increments the write pointer value by one.

Further, the FIFO memory 33 outputs data stored in its internal area indicated by its read pointer value from its output port 33b each time a signal applied to the read clock terminal 33d falls and then increments the read pointer value by one.

That is, the FIFO memory 33 is a first-in first-out memory arranged as described above. Suppose here that the number of internal data storage areas is 512. In other words, the write pointer value and the read pointer value each have a maximum number of 512.

Further, the FIFO memory 33 is generally regulated internally so that the write pointer value will not exceed the read pointer value. When the read pointer value is reached by the write pointer value, the potential at the flag terminal 33e is raised to a high level by way of example.

A rise in the potential at the flag terminal serves as a sampling halt request signal that is applied to the sampling signal generating circuit 31 and the control unit 40.

The FIFO memory 33 is supplied at its write clock terminal 33c with the sampling signals and at its input port 33a with digital data output from the A/D converter 32.

Thus, digital data from the A/D converter 32 are written sequentially into the FIFO memory 33 in synchronism with the rising edge of each sampling signal.

In FIG. 1, the prepoint counter 34 is a preset counter that constitutes the trigger enable circuit in the embodiment.

The prepoint counter 34 counts the number of sampling signals output from the sampling signal generating circuit 31, i.e., the number of digital data which has been stored into the FIFO memory since the commencement of sampling.

When counting a preset prepoint value (e.g., 100), the prepoint counter 34 outputs a trigger enable signal at a high level for example.

The trigger enable signal suppresses the occurrence of a trigger by the trigger generating circuit 35 to be described later during the interval from the commencement of sampling to the time when the number of digital data stored in the FIFO memory 33 reaches a predetermined number (prepoint value), thereby preventing digital data constituting a displayed waveform prior to the occurrence of a trigger from running short.

The prepoint value is preset by the control unit 40.

In FIG. 1, even if the amplitude of an input measured signal crosses the trigger level, the trigger generating circuit 35 ignores it during the interval from the commencement of sampling to the time of reception of a trigger enable signal. After the reception of a trigger enable signal, the trigger generating circuit generates a trigger signal when the amplitude of the measured signal crosses the trigger level.

In FIG. 1, the dummy readout circuit 36 provides the first read signals of the same period as the sampling signals to the read clock terminal 33d of the FIFO memory 33 through a switch 38 during the interval between a first moment that the prepoint counter 34 outputs a trigger enable signal and a second moment that the trigger generating circuit 35 generates a trigger signal, that is, during the interval in which digital data in excess of a predetermined number (prepoint value) have been already stored in the FIFO memory and a trigger signal has not been generated yet.

The switch 38 is changed over by the control unit 40 as described later.

An operator enters a desired prepoint value into the prepoint counter 34 and sets the trigger level of the trigger generating circuit 35 to a desired level through an operating unit 41 and the control unit 40 which comprises a microcomputer.

The control unit 40 outputs a sampling commencement request signal to the sampling signal generating circuit 31 at a predetermined time and then changes over the switch 38 from the dummy readout circuit 36 to the control unit 40 when the potential at the flag terminal 33e of the FIFO memory 33 goes high, that is, when a sampling halt request signal is produced.

Thereby, second read signals corresponding in number to digital data constituting a waveform to be displayed are successively applied from the control unit 40 to the read clock terminal 33d of the FIFO memory 33.

The control unit 40 converts digital data which have been read from the FIFO memory 33 by the second read signals into amplitude data for subsequent application to the display unit 42 for waveform display or to external equipment not shown.

The display unit 42 displays a dot in a position the height of which corresponds to amplitude data while shifting the displaying position on the screen horizontally on a point-by-point basis, thereby displaying a waveform corresponding to digital data.

FIG. 2A shows a specific arrangement of the trigger generating circuit 35.

That is, this trigger generating circuit has a comparator 351 and a D-type flip-flop (D-FF) 352.

The comparator 351 makes a comparison between the instantaneous amplitude level V1 of a measured signal and the trigger level V2 and provides VO=+VD when V1>V2 and VO=0 when V1<V2.

The D-FF 352 is responsive to the output Vo of the comparator 351 and a trigger enable signal from the prepoint counter 34 to generate such a trigger signal as described previously.

FIG. 2B shows a specific arrangement of the prepoint counter 34.

That is, this prepoint counter has a counter 341 and a D-FF 342.

The counter 341 counts the sampling signals and outputs a carry signal when the count reaches a prepoint value.

The D-FF 342 is responsive to the carry signal from the counter 341 to output such a trigger enable signal as described previously.

Although a clear signal for the D-FF 341 is not shown in FIG. 1, it is given by the control unit 40 by way of example.

FIG. 2C shows a specific arrangement of the dummy readout circuit 36.

That is, this dummy readout circuit has AND gates 361 and 362 and a D-FF 363.

The D-FF 363 latches the logical product of a trigger signal and a trigger enable signal from the AND gate 361 with a sampling signal.

The AND gate 362 outputs the logical product of the output of the D-FF 363 and a sampling signal as a first read signal that is in phase with that sampling signal.

Next, the operation of the waveform measuring apparatus 30 arranged as described previously will be described with reference to timing diagrams of FIGS. 3A to 3K.

Suppose now that the write pointer value and the read pointer value in the FIFO memory 33 have been set to the same value (e.g., the initial value 1) in advance and the switch 38 is in contact with the pseudo-readout circuit position.

When, in the state where a signal to be measured is being applied to the apparatus as shown in FIG. 3A, the control unit 40 issues a sampling commencement request signal at t=t1 as shown in FIG. 3B, sampling signals of a period of 25 nsec. (frequency=40 MHz) are output from the sampling signal generating circuit 31 as shown in FIG. 3C.

Since these sampling signals are applied to the A/D converter 32 and the write clock terminal 33c of the FIFO memory 33, digital data D(1), D(2), D(3), . . . obtained by sampling the measured signal at intervals of a time equal to the period of the sampling signals are applied in sequence to the input port 33a of the FIFO memory 33 and then stored thereinto at each falling edge of the sampling signals.

Note that, in FIGS. 3D and 3G, the digital data D(1), D(2), . . . , D(N+412) are merely represented by numerals 1, 2, . . . , N+412.

When the number of the sampling signals that have been produced by the sampling signal generating circuit 31 reaches a prepoint value (100) at t=t2, i.e., when 100 digital data, D(1) to D(100), have been stored into the FIFO memory 33, the prepoint counter 34 outputs a trigger enable signal at a high level as shown in FIG. 3E.

In response to the trigger enable signal, the dummy readout circuit 36 provides first read signals of the same period as the sampling signals to the read clock terminal 33d of the FIFO memory 33 as shown in FIG. 3F.

Thus, as shown in FIG. 3G, digital data are read from the FIFO memory 33 in sequence beginning with D(1).

After that, writing digital data into and reading digital data from the FIFO memory 33 are performed concurrently with the difference between its write pointer value and its read pointer value made coincident with the prepoint value (110).

Since a sequence of digital data read by the first read signals is not a candidate for display, the control unit 40 will not accept that sequence of digital data.

When the measured signal reaches a preset trigger level at t=t3 immediately after the N-th digital data D(N) has been written into the FIFO memory 33, a trigger signal at a high level is output from the trigger signal generating circuit 35 as shown in FIG. 3H.

In response to that trigger signal, the dummy readout circuit 36 stops to provide the first read signals to the FIFO memory 33. Thus, at time t=t3 and thereafter, only writing digital data D(N+1), D(N+2), . . . into the FIFO memory 33 is performed as shown in FIG. 3D.

From t=t3, 412 (=512−100) digital data are stored in the FIFO memory 33. At time t=t4 that the write pointer value within the FIFO memory 33 catches up with the read pointer value after cycling through the addresses of the FIFO memory 33, the potential at the flag terminal 33e of the FIFO memory 33 changes from a low level to a high level to thereby provide a sampling halt request signal as shown in FIG. 3I.

Thus, the sampling signal generating circuit 31 halts generating sampling signals until the reception of the next sampling commencement request signal.

Upon detecting a variation in the potential at the flag terminal 33e of the FIFO memory 33, the control unit 40 provides second read signals to the read clock terminal 33d of the FIFO memory 33 successively up to 512.

Thereby, 512 successive digital data, D(N–99), D(N–98), ..., D(N–1), D(N), D(N+1), ..., D(N+412) are read in sequence from the FIFO memory 33 as shown in FIG. 3G, then converted into amplitude data and fed into the display unit 42. Note that the digital data D(N–99) is data that has been stored the prepoint value (100) (100 sampling signal cycles) ahead of the trigger occurrence time.

Thus, on the screen of the display unit 42 is displayed a portion of the waveform of FIG. 3A that lies within a range P from the time that the digital data D(N–99) is sampled to the time that the digital data D(N+412) is sampled.

Figure 4A:
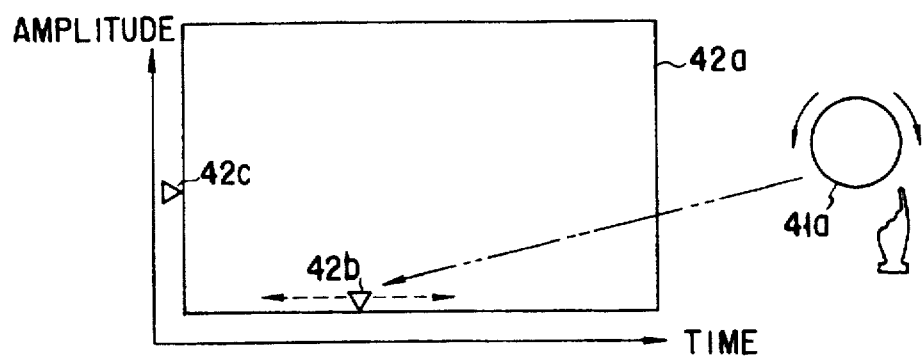
FIGS. 4A, 4B and 4C are diagrams for use in explanation of the pretrigger function according to the invention.
Figure 4B:
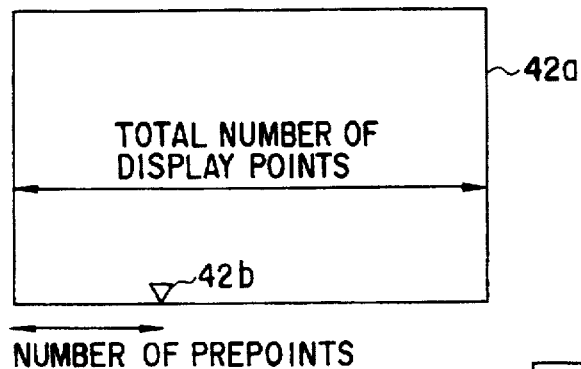
Figure 4C:
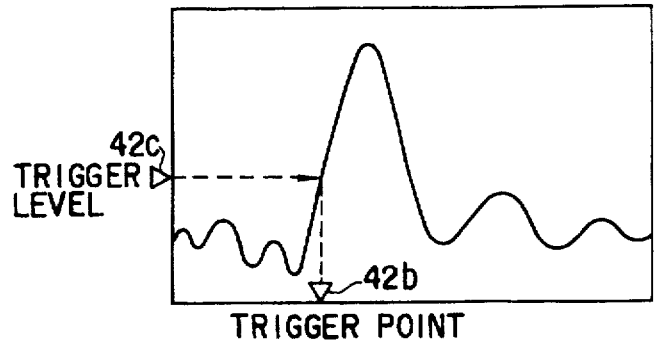
Figure 6:
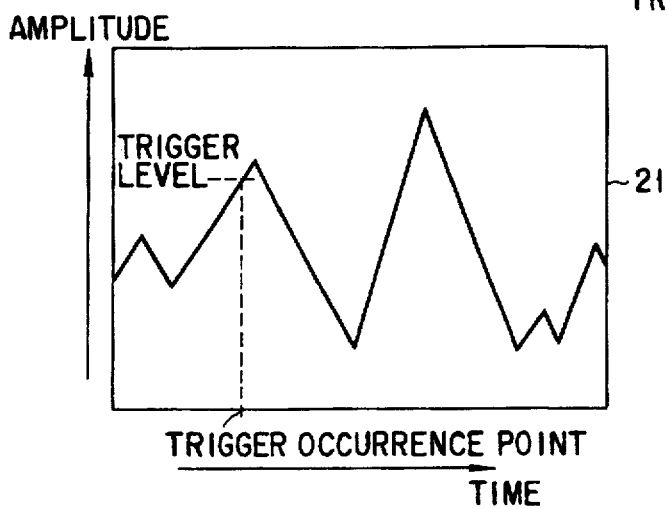
FIG. 6 shows an example of a displayed waveform in the prior art apparatus of FIG. 5.
Figure 5:
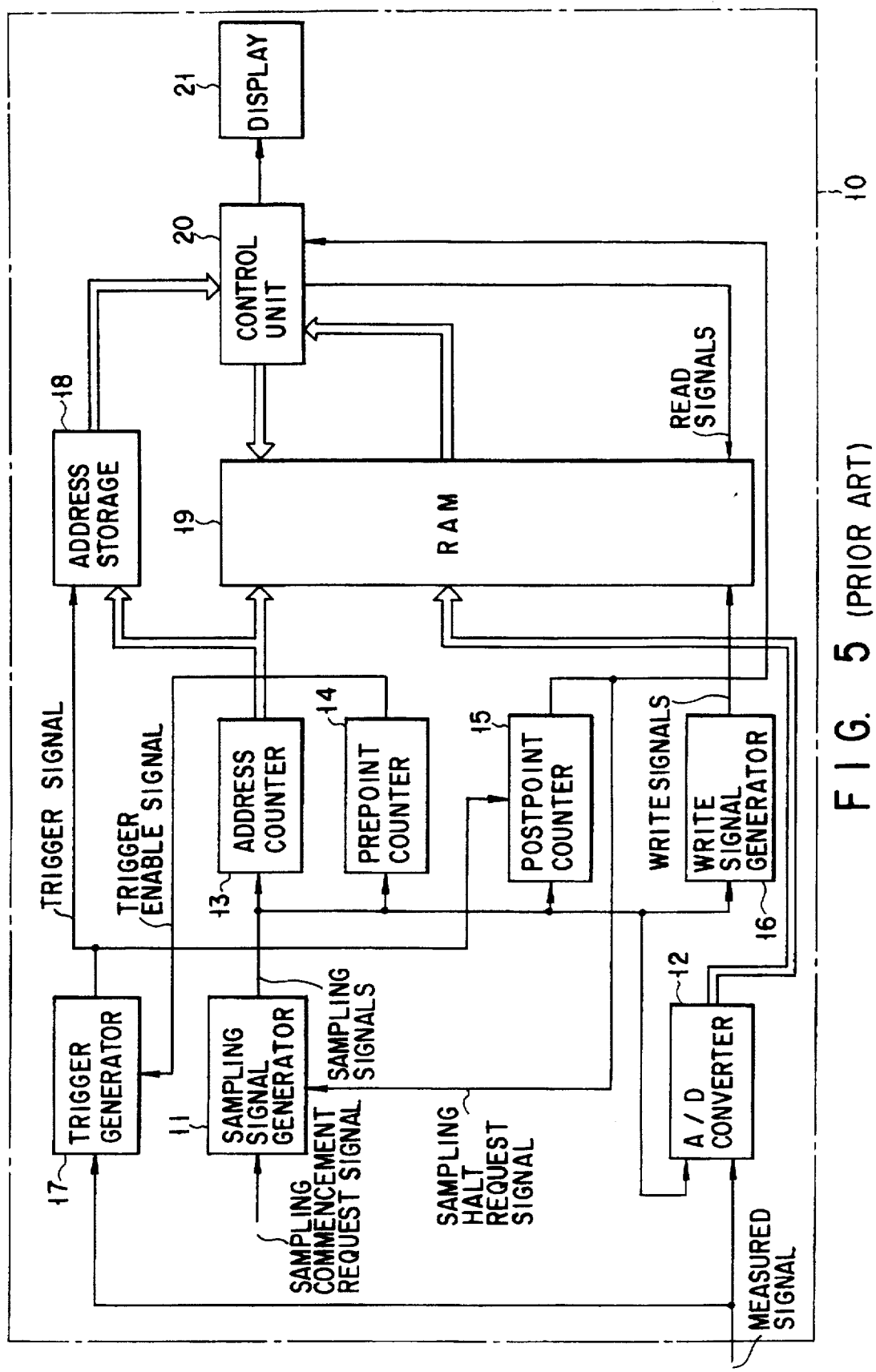
FIG. 5 is a block diagram of a prior art waveform measuring apparatus.

FIGS. 4A, 4B and 4C illustrate an operation image for the above-described pretrigger function according to the invention.

When an operator rotates an operating knob 41a on the operating unit 41 as shown in FIG. 4A, an indicator 42b, indicating the position of a point of trigger which is made movable along the time axis at the bottom of the display screen 42a, is placed in a desired position.

At the same time, an indicator 42c that is made movable along the amplitude axis at the left of the display screen 42a may also be placed in a desired position as needed.

Then, the control unit 40 calculates the number of prepoints from the position of the point of trigger and the total number of display points and then places it into the prepoint counter 34.

On termination of the sampling of a measured signal, the control unit 40 reads digital data corresponding in number to prepoints prior to the point of trigger and digital data corresponding in number to points after the point of trigger from the FIFO memory 33 for display on the display screen 42a.

Thus, the waveform measuring apparatus 30 is arranged such that the difference between write and read pointer values is kept matched with a prepoint value by performing writing into and reading from the FIFO memory 33 concurrently until a trigger signal is generated and digital data are read beginning with a sample that has been stored the prepoint value ahead of the trigger occurrence time by providing normal read signals after the occurrence of a trigger. Therefore, data for one display of a waveform to be displayed can be read immediately without performing address calculations.

In addition, the FIFO memory 33 is used in the waveform measuring apparatus. This eliminates the need for an address counter, a postpoint counter, a write signal generating circuit, and an address storage device, making the construction of peripheral hardware that attaches to the memory very simple. To ensure writing of digital data into the FIFO memory 33, it is only required to keep a digital data from the A/D converter 32 and a sampling signal in time coincidence. It is therefore possible to accommodate easily high speed sampling at intervals of 25 nsec. as in the present embodiment.

Although, in the embodiment, an output at the flag terminal 33e of the FIFO memory 33 is used to commence reading of digital data from the FIFO memory 33, the control unit 40 may commence outputting read signals immediately after the trigger occurrence time (t=t3) as shown in FIG. 3K.

This will enable the writing of digital data after the trigger occurrence time into the FIFO memory 33 and the reading of digital data stored before the trigger occurrence time from the FIFO memory 33 to be performed concurrently, further increasing the efficiency in capturing data for the next display.

Although the trigger generating circuit 35 is arranged to generate a trigger signal at the time when the amplitude of a measured signal crosses a trigger level, it may be arranged to output a trigger signal that is extracted from a signal (e.g., an internally generated periodic signal, or an externally applied signal, or a single-shot signal entered by a manual operation) that is different from the measured signal.

In this case as well, a trigger signal is timed to occur after at least a predetermined number of sampling signals has been outputted.

In the embodiment, a FIFO memory is used which has a capacity of 512 pieces of digital data. The FIFO memory is only required to have a capacity to store at least data representing a waveform to be displayed on a screen.

In the embodiment, the generation of sampling signals is halted by an output at the flag terminal of the FIFO memory that indicates that the write pointer value has caught up with the read pointer value. However, this is not restrictive.

Generally, a FIFO memory does not accept the writing of data into it after its write pointer value cycles through memory addresses and catches up with its read pointer value.

For this reason, the use of such a FIFO memory obviates the necessity of halting the generation of sampling signals at the time that the write pointer value catches up with the read pointer value. Thus, the generation of sampling signals may be halted by the control unit 40 or the like at any time before effective samples to be displayed as a waveform are read from the FIFO memory 33.

In the embodiment, the first read signals outputted from the dummy readout circuit 36 and the second read signals outputted from the control unit 40 are applied to the read clock terminal of the FIFO memory 33 through the switch 38. However, since the first and second read signals are not generated simultaneously, they may be applied to the read clock terminal of the FIFO memory 33 through an OR gate or the like without using the switch 38.

As described above, the waveform measuring apparatus of the present invention is arranged such as to convert a measured signal into digital data in synchronism with sampling signals, apply the resulting digital samples to the input port of a FIFO memory, apply the sampling signals to the write clock terminal of the memory to thereby store the digital data into the FIFO memory in sequence, read digital data from the FIFO memory by first read signals of the same period as the sampling signals during the interval between the first moment that the number of digital data stored in the FIFO memory reaches a predetermined number and the second moment that a trigger signal is generated, and write digital data into the FIFO memory while maintaining a state where reading of a sequence of digital data beginning with a digital data that is a predetermined number of digital data ahead of the trigger occurrence time can be commenced immediately by simply applying second read signals to the FIFO memory.

Accordingly, the waveform measuring apparatus of the present invention eliminates the need for an address counter for designating the addresses of digital data, a counter for counting digital data written after the occurrence of a trigger, an address storage device and the like. This allows the construction of peripheral hardware associated with the memory to be made significantly simple. Moreover, by simply keeping a digital data and a sampling signal, which are applied to the FIFO memory, in time coincidence within one cycle period of sampling signals, writing of digital data into the FIFO memory can be ensured, permitting high speed sampling to be accommodated.

Furthermore, with the waveform measuring apparatus of the present invention, there is no need of calculating a read starting address for effective data for waveform display. At any time after the trigger occurrence time, reading of digital data can be commenced immediately beginning with a digital data that is a predetermined number ahead of the trigger occurrence time, which permits the capture of waveform data for the next display to be commenced immediately and reduces the possibility of overlooking a variation in a measured signal.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A waveform measuring instrument comprising:

a sampling signal generator for generating sampling signals of a given period;

an A/D converter for sampling an input signal to be measured and for converting said input signal into digital data, said A/D converter sampling said input signal at intervals of the given period of said sampling signals generated by said sampling signal generator;

a FIFO memory having an input port, an output port, a write clock terminal, and a read clock terminal, said FIFO memory storing said digital data produced by said A/D converter when said digital data are applied from said A/D converter to said input port, said digital data being stored in sequence each time said sampling signals generated by said sampling signal generator are applied to said write clock terminal;

a trigger enable circuit for outputting a trigger enable signal when a predetermined number of said sampling signals are generated by said sampling signal generator;

a trigger signal generating circuit for generating a trigger signal after said trigger enable signal has been outputted by said trigger enable circuit;

a dummy readout circuit for applying first read signals to said read clock terminal of said FIFO memory during an interval between a first moment when said trigger enable signal is outputted from said trigger enable circuit and a second moment when said trigger signal is generated by said trigger signal generating circuit, said first read signals having a same period as said given period of said sampling signals and being shifted in phase by a time corresponding to said predetermined number of said sampling signals, and said first read signals causing said FIFO memory to delete least recent ones of said digital data stored therein and to concurrently store most recent ones of said digital data produced by said A/D converter responsive to said sampling signals;

a readout device for, after said trigger signal has been generated by said trigger signal generating circuit, applying to said read clock terminal of said FIFO memory second read signals for causing said digital data stored in said FIFO memory to be read out from said output port thereof, said FIFO memory storing said digital data which are inputted thereto during an interval corresponding to said predetermined number of said sampling signals from the generation of said trigger signal by said trigger signal generating circuit; and a display for displaying a waveform of said input signal responsive to said digital data being read by said readout device.

2. The apparatus according to claim 1, wherein said FIFO memory outputs a flag indicating that a write pointer value has caught up with a read pointer value, and wherein said readout device applies said second read signals to said read clock terminal of said FIFO memory responsive to said FIFO memory outputting said flag.

3. The apparatus according to claim 2, wherein said readout device applies said second read signals to said read clock terminal of said FIFO memory immediately after the generation of said trigger signal by said trigger signal generating circuit.

4. The apparatus according to claim 3, wherein said trigger signal generating circuit generates said trigger signal at a time when said input signal crosses a desired trigger level.

5. The apparatus according to claim 4, wherein said trigger enable circuit includes a prepoint counter into which a desired number of measuring points prior to the generation of said trigger signal by said trigger signal generating circuit is preset, said trigger enable circuit outputting said trigger enable signal when a count in said prepoint counter of said sampling signals from said sampling signal generating circuit reaches the desired number of said measuring points.

6. The apparatus according to claim 5, wherein said trigger signal generating circuit includes a comparing device for comparing an amplitude of said input signal with a desired trigger level, and a generator for generating said trigger signal responsive to an output from said comparing device and an output of said trigger enable signal from said trigger enable circuit.

7. The apparatus according to claim 6, wherein said dummy readout circuit includes a phase setting device for setting a definite phase of said first read signals responsive to said trigger signal generated by said trigger signal generating circuit, an output from said prepoint counter of said trigger enable circuit, and said sampling signals generated by said sampling signal generator.

* * * * *